(12) United States Patent
Mun et al.

(10) Patent No.: US 11,715,628 B2
(45) Date of Patent: Aug. 1, 2023

(54) METHOD OF FORMING PLASMA PROCESSING APPARATUS, RELATED APPARATUS, AND METHOD OF FORMING SEMICONDUCTOR DEVICE USING THE SAME

(71) Applicant: SAMSUNG ELECTRONICS CO., LTD., Suwon-si (KR)

(72) Inventors: Jeongil Mun, Hwaseong-si (KR); Kyeonghun Kim, Hwaseong-si (KR); Taekyoon Park, Seoul (KR); Jongwoo Sun, Hwaseong-si (KR); Seeyub Yang, Seoul (KR); Yongseok Lee, Yongin-si (KR); Hyungjoo Lee, Hwaseong-si (KR); Eunhee Jeang, Paju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 17/184,962

(22) Filed: Feb. 25, 2021

(65) Prior Publication Data

US 2022/0044912 A1 Feb. 10, 2022

(30) Foreign Application Priority Data

Aug. 10, 2020 (KR) .......................... 10-2020-0099852

(51) Int. Cl.
*H01J 37/32* (2006.01)
*H01J 9/24* (2006.01)

(52) U.S. Cl.
CPC ........ *H01J 37/32467* (2013.01); *H01J 9/245* (2013.01); *H01J 37/32119* (2013.01); *H01J 37/32238* (2013.01); *H01J 37/32972* (2013.01); *H01J 2237/103* (2013.01)

(58) Field of Classification Search
CPC ........... H01J 37/32467; H01J 37/32119; H01J 37/32238; H01J 37/32972; H01J 9/245; H01J 2237/103
See application file for complete search history.

(56) References Cited

U.S. PATENT DOCUMENTS 6,592,817 B1 * 7/2003 Tsai .................. H01J 37/32935
422/62
2004/0074602 A1 4/2004 Lee
(Continued)

FOREIGN PATENT DOCUMENTS

JP 5731292 B2 6/2015
JP 2016-100547 A 5/2016
KR 20090005719 A * 1/2009 ............. H01L 21/02
(Continued)

*Primary Examiner* — Henry Luong
(74) *Attorney, Agent, or Firm* — Lee IP Law, P.C.

(57) ABSTRACT

A method of forming a plasma processing apparatus comprises providing a chamber, the chamber including a wall defining an interior, and a viewport extending through the wall. An analysis apparatus connected to the viewport may be formed. The analysis apparatus includes an analyzer adjacent to the chamber, a probe connected to the analyzer and aligned with the viewport, and a first window aligned with the probe, the first window having a first surface, and a second surface at an opposite side relative to the first surface, the second surface being exposed to the interior of the chamber, and the second surface of the first window has a scattering surface.

17 Claims, 11 Drawing Sheets

(56) References Cited

U.S. PATENT DOCUMENTS

2010/0252546 A1* 10/2010 Herden ................ G01M 15/10
  219/205
2011/0284163 A1* 11/2011 Yoon ................ H01J 37/32935
  156/345.24

FOREIGN PATENT DOCUMENTS

KR  10-1474969 B1  12/2014
KR  10-2019-0116668 A  10/2019

* cited by examiner

METHOD OF FORMING PLASMA PROCESSING APPARATUS, RELATED APPARATUS, AND METHOD OF FORMING SEMICONDUCTOR DEVICE USING THE SAME

CROSS-REFERENCE TO THE RELATED APPLICATION

Korean Patent Application No. 10-2020-0099852, filed on Aug. 10, 2020, in the Korean Intellectual Property Office, and entitled: "Plasma Processing Apparatus Including Window, Analysis Apparatus, and Chamber," is incorporated by reference herein in its entirety.

BACKGROUND

1. Field

Embodiments relate to a method of forming a plasma processing apparatus, related apparatus, and a method of forming semiconductor device using the same.

2. Description of the Related Art

A plasma processing apparatus may be used in a manufacturing process for a semiconductor device. The plasma processing apparatus may include a viewport in order to check a state of an interior thereof.

SUMMARY

The embodiments may be realized by providing a plasma processing apparatus including a chamber, the chamber including a wall defining an interior, and a viewport extending through the wall; and an analysis apparatus connected to the viewport, wherein the analysis apparatus includes an analyzer adjacent to the chamber, a probe connected to the analyzer and aligned with the viewport, and a first window aligned with the probe, the first window having a first surface, and a second surface at an opposite side relative to the first surface, the second surface being exposed to the interior of the chamber, and the second surface of the first window has a scattering surface.

The embodiments may be realized by providing an analysis apparatus including an analyzer; a probe connected to the analyzer; and a first window aligned with the probe, the first window having a first surface, and a second surface at an opposite side relative to the first surface, wherein the second surface has a scattering surface.

The embodiments may be realized by providing a chamber including a wall defining an interior of the chamber; and a viewport extending through the wall, wherein the viewport includes a first window having a first surface and a second surface at an opposite side relative to the first surface, and the second surface is exposed to the interior of the chamber and has a scattering surface.

The embodiments may be realized by providing a method of forming a plasma processing apparatus. The method comprising: providing a chamber, the chamber including a wall defining an interior, and a viewport extending through the wall; and forming an analysis apparatus connected to the viewport. Wherein the analysis apparatus includes an analyzer adjacent to the chamber, a probe connected to the analyzer and aligned with the viewport, and a first window aligned with the probe, the first window having a first surface, and a second surface at an opposite side relative to the first surface, the second surface being exposed to the interior of the chamber, and the second surface of the first window has a scattering surface.

The embodiments may be realized by providing a method of forming a semiconductor device using a plasma processing apparatus. The method comprising: loading a substrate in a chamber, the chamber including a wall defining an interior, and a viewport extending through the wall; and monitoring a state of the interior of the chamber through an analysis apparatus connected to the viewport. Wherein the analysis apparatus includes an analyzer adjacent to the chamber, a probe connected to the analyzer and aligned with the viewport, and a first window aligned with the probe, the first window having a first surface, and a second surface at an opposite side relative to the first surface, the second surface being exposed to the interior of the chamber, the second surface of the first window has a scattering surface, and a roughness of the second surface of the first window is rougher than a roughness of the first surface of the first window.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
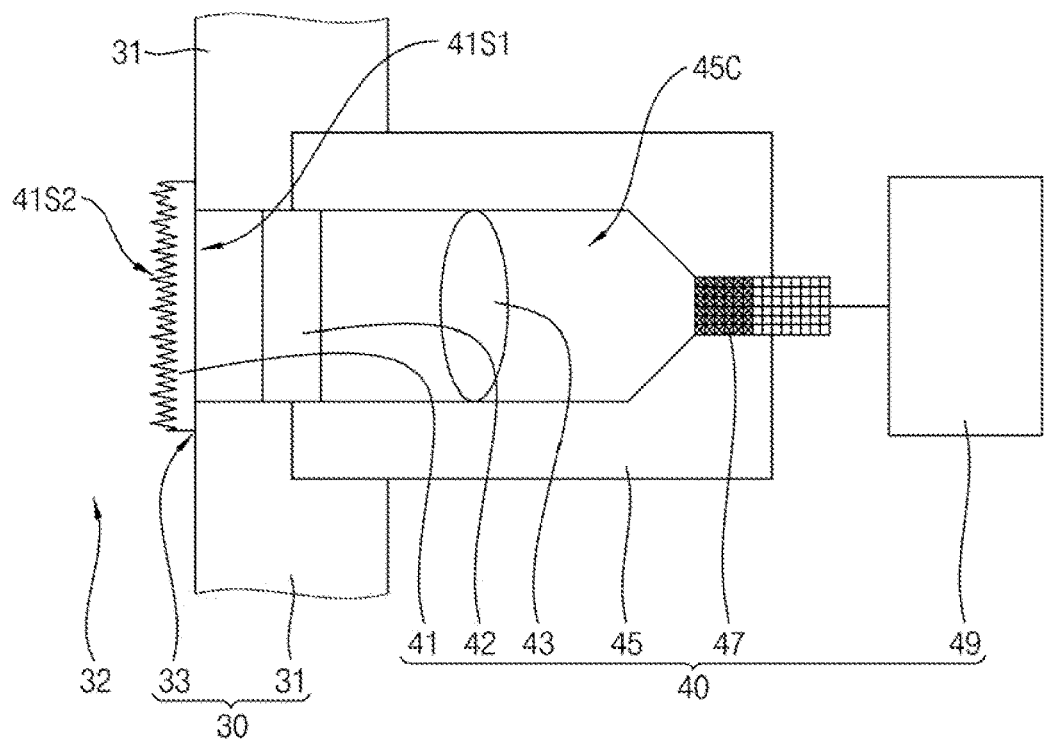
FIG. 1 is a sectional view of a part of a plasma processing apparatus according to exemplary embodiments of the disclosure.
Figure 2:
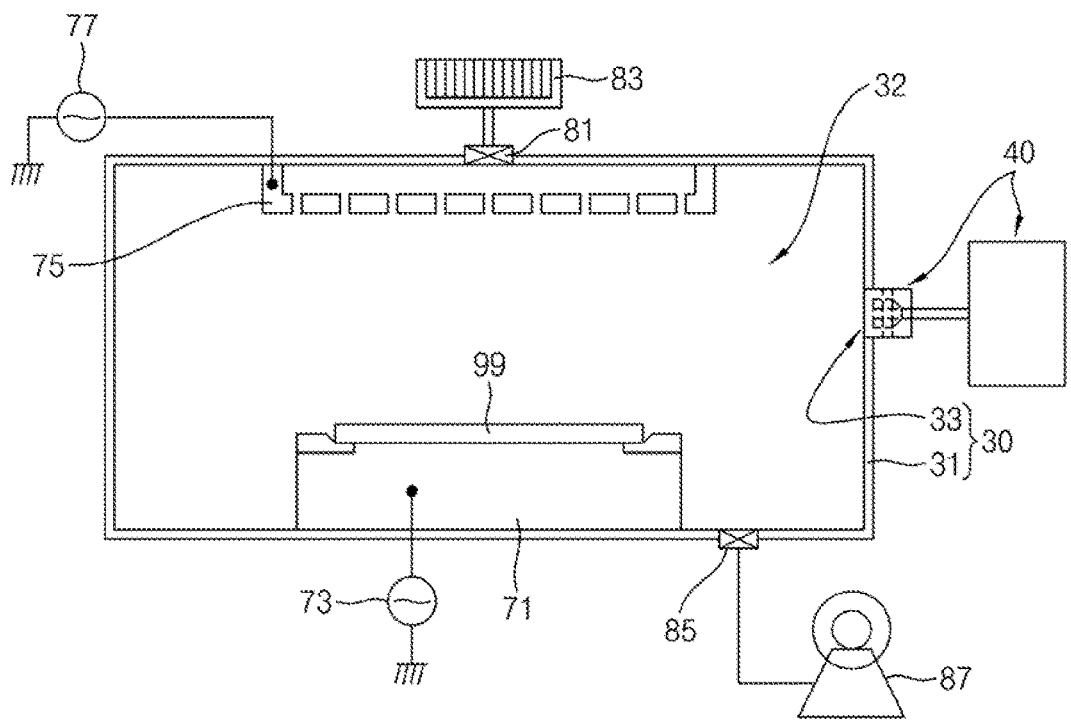
FIG. 2 is a schematic view of the plasma processing apparatus.

FIG. 1 is a sectional view of a part of a plasma processing apparatus according to exemplary embodiments of the disclosure. FIG. 2 is a schematic view of the plasma processing apparatus. In an implementation, the plasma processing apparatus according to the exemplary embodiments of the disclosure may include a plasma etching apparatus or a plasma-enhanced atomic layer etching (PE-ALE) apparatus.

Referring to FIG. 1, the plasma processing apparatus according to the exemplary embodiments of the disclosure may include a chamber 30 and an analysis apparatus 40. In an implementation, the analysis apparatus 40 may include an optical emission spectrometer (OES).

The chamber 30 may include a wall 31 defining an interior 32, and a viewport 33 extending through the wall 31. The analysis apparatus 40 may be connected to the viewport 33. The analysis apparatus 40 may include a first window 41, a second window 42, a third window 43, a case 45, a probe 47, and an analyzer 49. Each of the first window 41, the second window 42, and the third window 43 may include a light-transmissive material, e.g., quartz or glass. The first window 41 may have a first surface 41S1, and a second surface 41S2 at an opposite side to the first surface 41S1. The case 45 may include a cavity 45C. As used herein, the terms "first," "second," "third," etc., are merely for identification, and are not intended to imply or require sequential inclusion of the elements.

The analyzer 49 may be adjacent to the chamber 30. The probe 47 may be connected to the analyzer 49 and may be aligned with the viewport 33. In an implementation, the probe 47 may include an optical probe. The probe 47 may include an optical fiber connected to the analyzer 49. The probe 47 may extend through the case 45 such that the probe 47 is exposed in the cavity 45C. The cavity 45C may be defined by an inclined side wall of the case 45 adjacent to the probe 47. The case 45 may be coupled to the wall 31. The inclined side wall of the case 45 (e.g., the inclined inner side wall of the cavity 45C) may help focus light incident through the first window 41, the second window 42, and the third window 43 toward the probe 47. In an implementation, the probe 47 may extend through the case 45 such that the probe 47 partially protrudes into the cavity 45C.

The first window 41 may be adjacent to the probe 47. The first window 41 may cover the viewport 33. In an implementation, the first window 41 may contact (e.g., directly contact) an inner surface of the wall 31. The first surface 41S1 may be adjacent to or face the probe 47. The second surface 41S2 may protrude into the interior 32 of the chamber 30. The second surface 41S2 may be exposed to the interior 32 of the chamber 30.

The second surface 41S2 of the first window 41 may include or may be a scattering surface. In an implementation, a roughness of the second surface 41S2 may be relatively rougher than a roughness of the first surface 41S1. A root mean square (RMS) roughness of the second surface 41S2 may be 0.2 μm or more. In an implementation, the RMS roughness of the second surface 41S2 may be 0.2 μm to 10 μm.

The second window 42 may be between the first window 41 and the probe 47. The second window 42 may contact (e.g., directly contact) the wall 31 and the case 45. The second window 42 may have a greater thickness than the first window 41. The first window 41 and the second window 42 may help maintain a pressure of the interior 32 of the chamber 30. The first window 41 may be spaced apart from the second window 42. In an implementation, the second surface 41S2 of the first window 41 may be rougher than surfaces of the second window 42.

The third window 43 may be between the second window 42 and the probe 47. The third window 43 may be within the cavity 45C of the case 45. At least one surface of the third window 43 may include or may be a spherical surface. In an implementation, the third window 43 may include or may be a convex lens. The third window 43 may be spaced apart from the second window 42 and the probe 47. The third window 43 may be aligned with the probe 47. The third window 43 may help focus light incident through the first window 41 and the second window 42 toward the probe 47. In an implementation, the second surface 41S2 of the first window 41 may be relatively rougher than surfaces of the third window 43.

In an implementation, the first window 41, the second window 42, and the third window 43 may correspond to a part of constituent elements of the viewport 33.

Referring to FIG. 2, the plasma processing apparatus according to the exemplary embodiments of the disclosure may include the chamber 30, the analysis apparatus 40, a pedestal 71, a first power supply 73, an upper electrode 75, a second power supply 77, a gas introduction port 81, a gas supplier 83, an exhaust port 85, and an exhaust device 87.

The chamber 30 may include a wall 31 defining an interior 32, and a viewport 33 extending through the wall 31. The analysis apparatus 40 may be connected to the viewport 33. The pedestal 71 may be within the interior 32 of the chamber 30. A substrate 99 may be laid or accommodated on the pedestal 71. The substrate 99 may include a semiconductor substrate such as a silicon wafer or a silicon-on-insulator (SOI) wafer. The pedestal 71 may be connected to the first power supply 73.

The gas introduction port 81 may extend through a portion of the wall 31. The gas supplier 83 may communicate with (e.g., may be in fluid communication with) the gas introduction port 81. The gas supplier 83 may supply an etching gas, an inert gas, or a combination thereof to the interior 32 through the gas introduction port 81. The upper electrode 75 may be adjacent to the gas introduction port 81. The upper electrode 75 may face the substrate 99. The upper electrode 75 may be connected to the second power supply 77. It may be possible to adjust the density and directionality of a plasma gas in the interior 32 by controlling the gas supplier 83, the gas introduction port 81, the upper electrode 75, the second power supply 77, and the first power supply 73.

The exhaust port 85 may extend through a portion of the wall 31. The exhaust device 87 may help discharge reaction by-products from the interior 32 through the exhaust port 85. The exhaust device 87 may include a vacuum pump or a scrubber.

In an exemplary embodiment of the present inventive concept, a method of forming a plasma processing apparatus is provided. The method comprises providing the chamber 30, the chamber 30 including the wall 31 defining the interior 32, and the viewport 33 extending through the wall 31. The analysis apparatus 40 connected to the viewport 33 may be formed.

In an exemplary embodiment of the present inventive concept, a method of forming a semiconductor device using a plasma processing apparatus is provided. The method comprises loading the substrate 99 in the chamber 30, the chamber 30 including the wall 31 defining the interior 32, and the viewport 33 extending through the wall 31. A state of the interior 32 of the chamber 30 through the analysis apparatus 40 connected to the viewport 33 may be monitored.

FIGS. 3, 4, 6, and 7 are sectional views of a part of a plasma processing apparatus according to exemplary embodiments of the disclosure. FIG. 5 is a plan view of the part of the plasma processing apparatus according to the exemplary embodiments of the disclosure.

Figure 3:
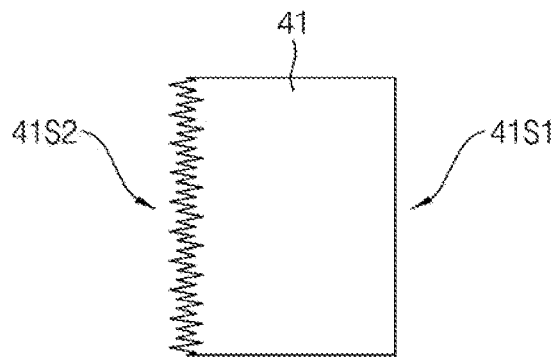
FIGS. 3, 4, 6, and 7 are sectional views of a part of a plasma processing apparatus according to exemplary embodiments of the disclosure.

Referring to FIG. 3, the first window 41 may include a first surface 41S1, and a second surface 41S2 at an opposite side relative to the first surface 41S1. The second surface 41S2 may include or may be a scattering surface. In an implementation, the second surface 41S2 may be relatively rougher than the first surface 41S1. The root mean square (RMS) roughness of the second surface 41S2 may be 0.2 to 10 μm. In an implementation, the second surface 41S2 may be formed using surface treatment (e.g., roughening) technology, e.g., sandblasting.

Figure 4:
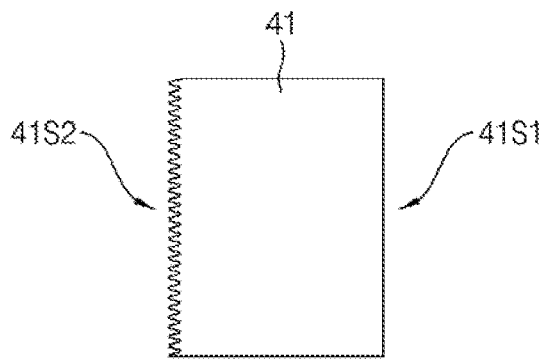
Figure 5:
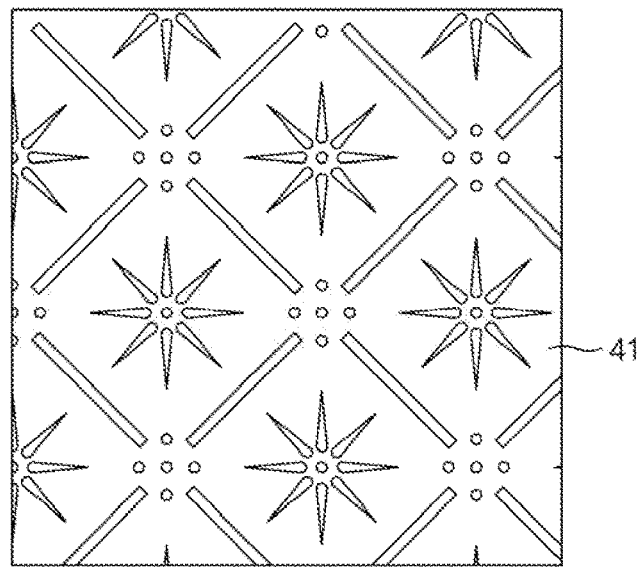
FIG. 5 is a plan view of the part of the plasma processing apparatus according to the exemplary embodiments of the disclosure.

In an implementation, referring to FIG. 4, the second surface 41S2 may be formed using surface treatment technology, e.g., acid etching.

Figure 6:
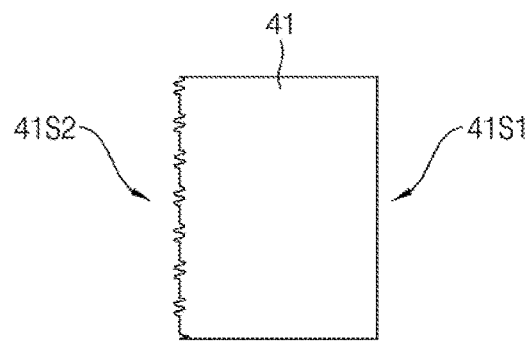

In an implementation, referring to FIGS. 5 and 6, the second surface 41S2 may be formed using surface treatment technology such as acid etching. The second surface 41S2 may include various cross-sections and various planes. In an implementation, the second surface 41S2 may include various kinds of scattering grooves.

Figure 7:
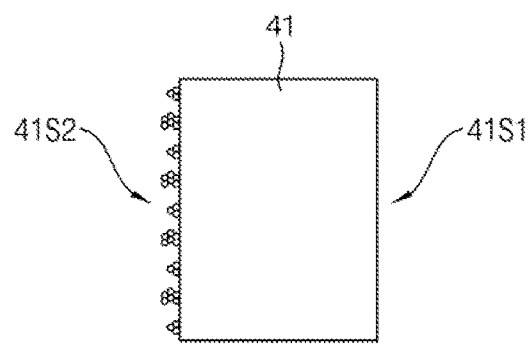

In an implementation, referring to FIG. 7, the second surface 41S2 may be formed using surface treatment technology such as coating, deposition, or a combination thereof. In an implementation, the second surface 41S2 may be formed using a nano-silica coating method.

Figure 8:
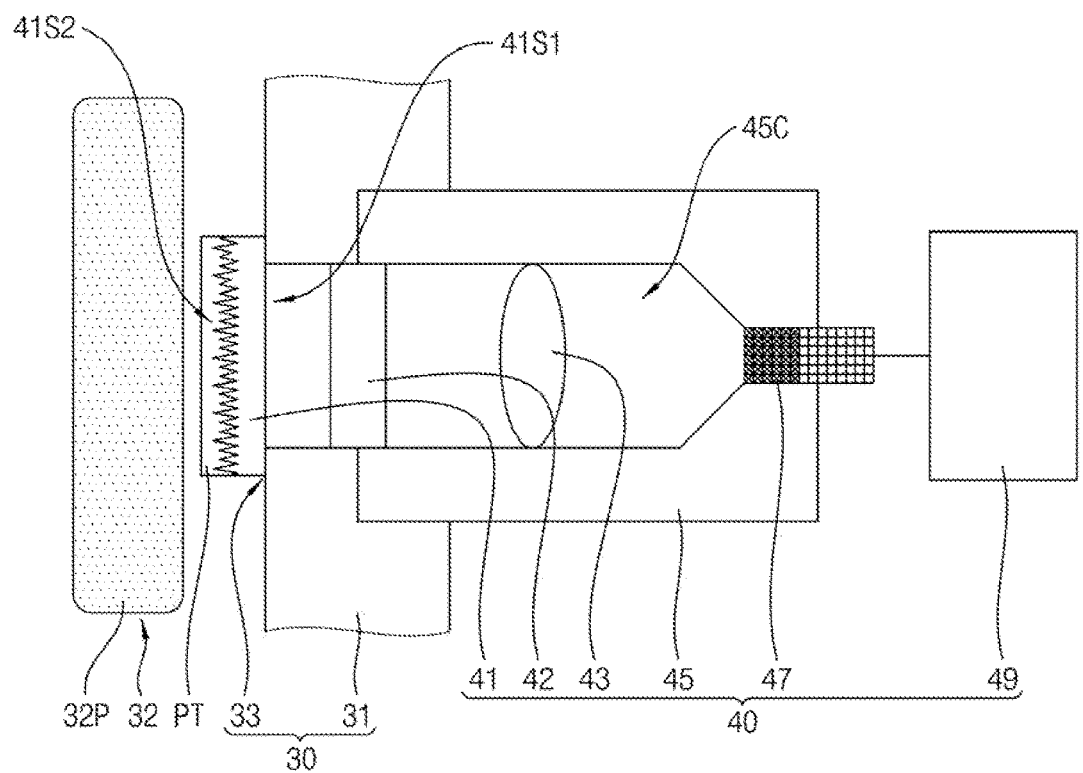
FIG. 8 is a sectional view of experimental examples of the plasma processing apparatus according to the exemplary embodiments of the disclosure.

FIG. 8 is a sectional view of experimental examples of the plasma processing apparatus according to the exemplary embodiments of the disclosure.

Referring to FIGS. 2 and 8, a manufacturing process for a semiconductor device may include a plasma etching process such as a high aspect ratio contact (HARC) process. The plasma processing device according to the exemplary embodiments of the disclosure may be used in the plasma etching process. In an implementation, plasma 32P may be formed in the interior 32 of the chamber 30. The analysis apparatus 40 may check or analyze a state of the plasma 32P.

In an implementation, the analysis apparatus 40 may be used for end point detection (EPD). The state of the plasma 32P may be varied based on the kind of a material discharged after being etched from the substrate 99. State variation of the plasma 32P may be sensed through the probe 47, and may be analyzed by the analyzer 49. A polymeric thin film PT may be formed on the first window 41. The polymeric thin film PT may pass through or block transmission through the first window 41, thereby causing interference of a signal sensed by the probe 47.

The thickness of the polymeric thin film PT may gradually increase with passage of a process time. The thickness increase of the polymeric thin film PT may cause an increase in an interference signal. The interference signal may gradually increase with passage of the process time. Scattering of the interference signal may also gradually increase with passage of the process time. In an implementation, the thickness of the polymeric thin film PT may be repeatedly increased and decreased with passage of the process time. The interference signal may repeatedly exhibit reinforced interference and offset interference, depending on the thickness of the polymeric thin film PT.

The plasma processing apparatus according to the exemplary embodiments of the disclosure may include the second surface 41S2, e.g., a scattering surface. The second surface 41S2 of the first window 41 may be relatively rougher than the first surface 41S1. The second surface 41S2, e.g., the scattering surface, may attenuate the interference signal. The second surface 41S2 may help minimize an increase in the interference signal. The second surface 41S2 may help minimize an increase in scattering of the interference signal.

Figure 9:
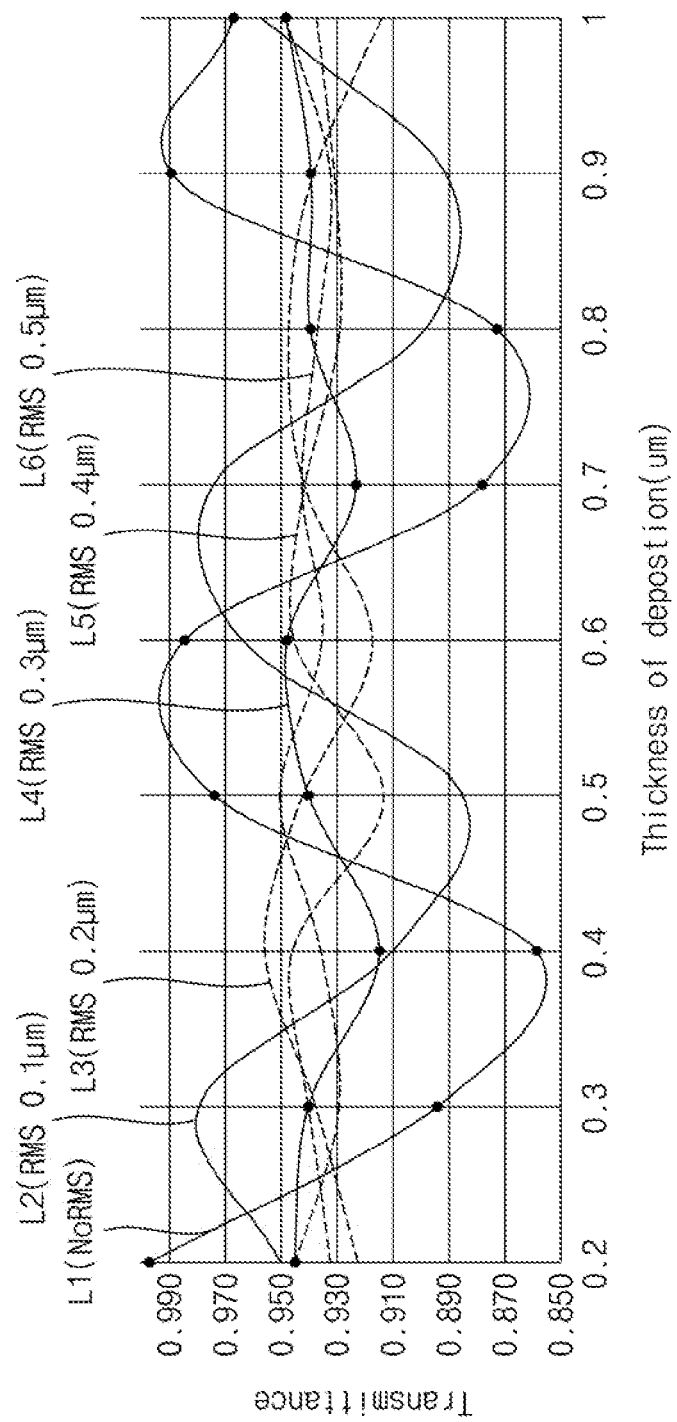
FIG. 9 is a graph of experimental examples of the plasma processing apparatus according to the exemplary embodiments of the disclosure.

FIG. 9 is a graph of experimental examples of the plasma processing apparatus according to the exemplary embodiments of the disclosure.

Referring to FIG. 9, a horizontal axis represents a thickness of deposition of the polymeric thin film PT. A vertical axis represents a transmittance. A curve L1 represents simulation results exhibited in the case in which the second surface 41S2 does not have a scattering surface. The curve L1 may correspond to simulation results exhibited when the second surface 41S2 has substantially the same surface roughness as the first surface 41S1.

A curve L2 represents simulation results exhibited when the root mean square (RMS) roughness of the second surface 41S2 is 0.1 µm. A curve L3 represents simulation results exhibited when the RMS roughness of the second surface 41S2 is 0.2 µm. A curve L4 represents simulation results exhibited when the RMS roughness of the second surface 41S2 is 0.3 µm. A curve L5 represents simulation results exhibited when the RMS roughness of the second surface 41S2 is 0.4 µm. A curve L6 represents simulation results exhibited when the RMS roughness of the second surface 41S2 is 0.5 µm.

As shown, it may be seen that the curve L2 exhibits a slight decrease in the level of an interference signal while also exhibiting a slight decrease in scattering of the interference signal, as compared to the curve L1. It may be seen that the curves L3 to L6 exhibit a considerable decrease in the level of the interference signal while also exhibiting a considerable decrease in scattering of the interference signal, as compared to the curve L1. Through adjustment of the surface roughness of the second surface 41S2, it may be possible to attenuate the interference signal, to minimize an increase range of the interference signal with passage of the process time, and to minimize an increase in scattering of the interference signal with passage of the process time.

FIGS. 10 to 27 are sectional views of a part of a plasma processing apparatus according to exemplary embodiments of the disclosure.

Figure 10:
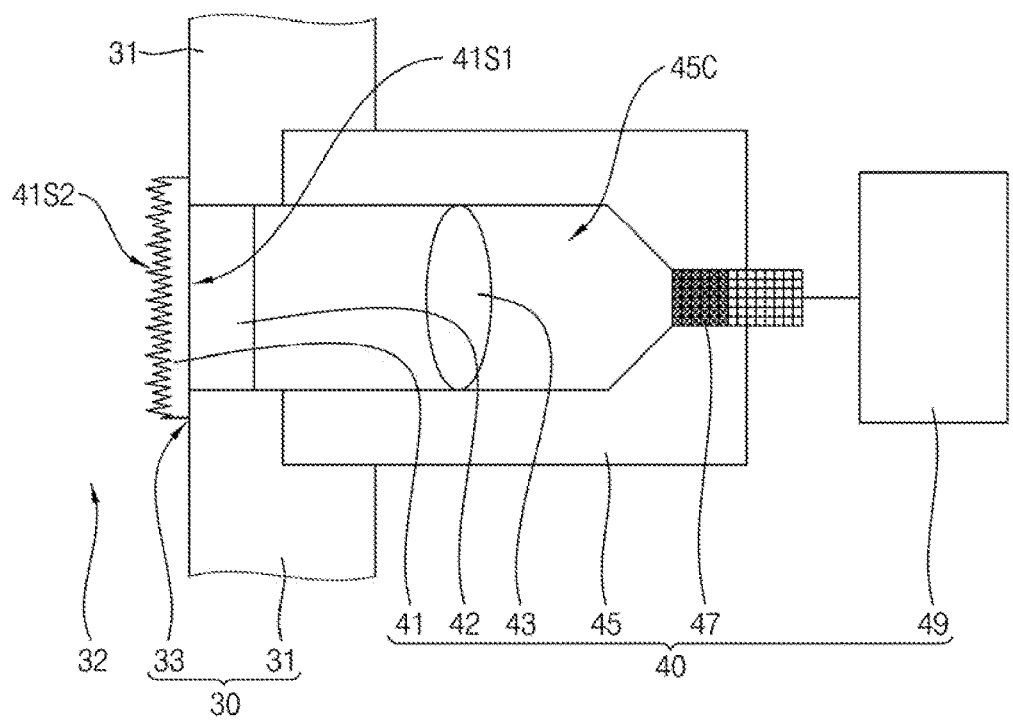
FIGS. 10 to 27 are sectional views of a part of a plasma processing apparatus according to exemplary embodiments of the disclosure.

Referring to FIG. 10, a second window 42 may contact (e.g., directly contact) a first surface 41S1 of a first window 41. The second window 42 may be defined within a viewport 33. The second window 42 may contact (e.g., directly contact) a wall 31. The second window 42 may be spaced apart from a case 45. The third window 43 may be within a cavity 45C.

Figure 11:
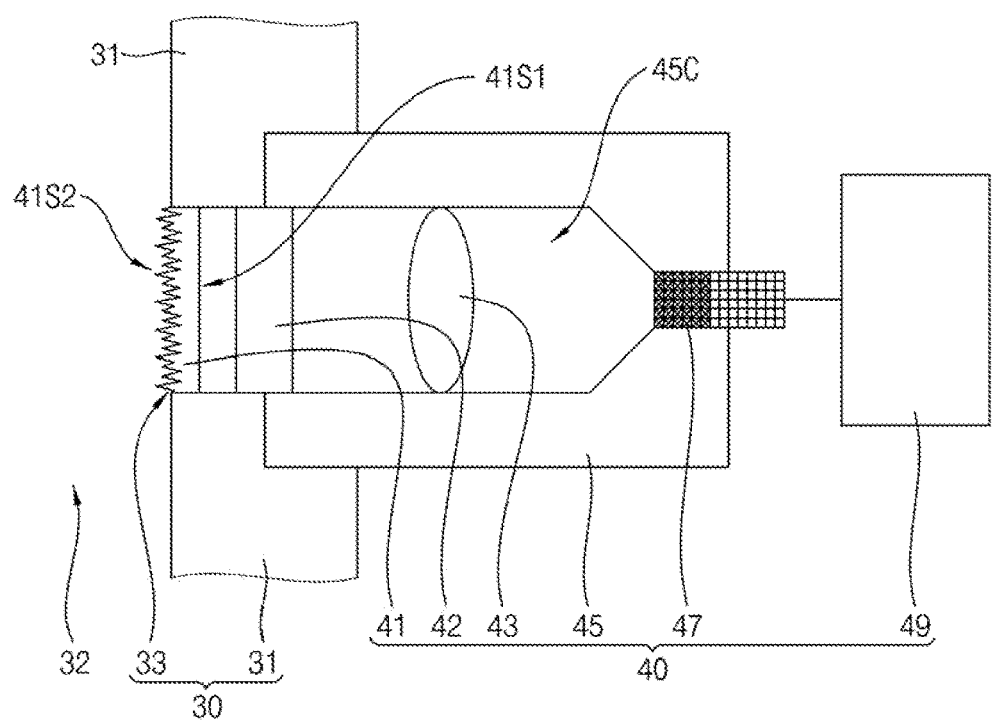

Referring to FIG. 11, a first window 41 may be defined within a viewport 33. The first window 41 may contact (e.g., directly contact) a wall 31. The first window 41 may be spaced apart from a second window 42.

Figure 12:
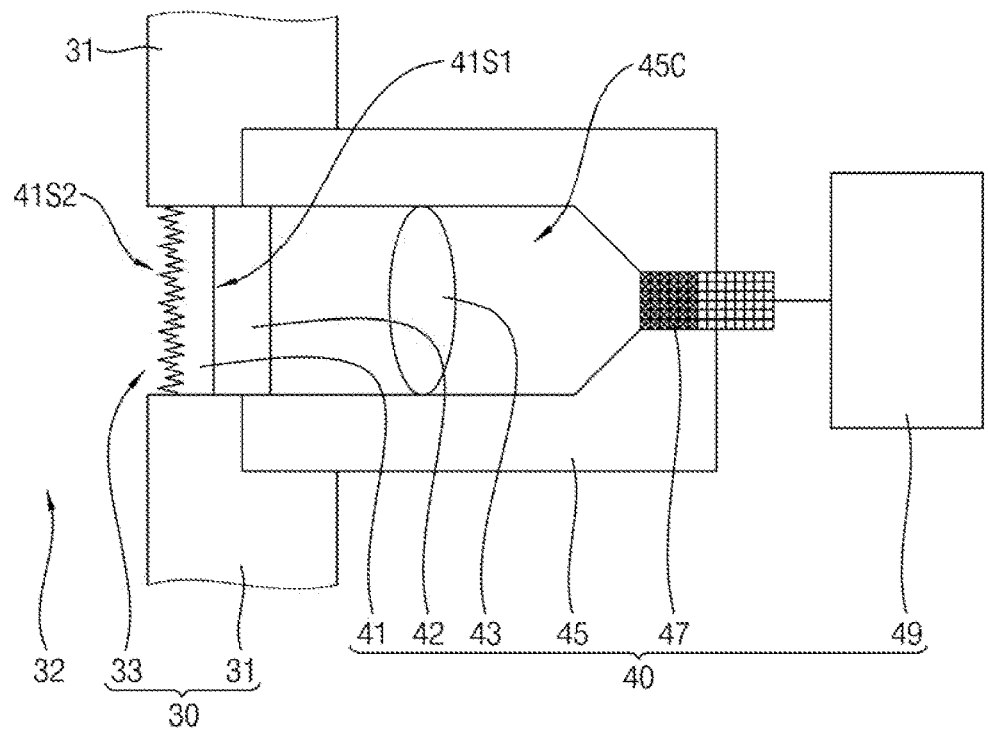

Referring to FIG. 12, a first window 41 may be defined (e.g., recessed) within a viewport 33. The first window 41 may contact (e.g., directly contact) a second window 42. A second surface 41S2 of the first window 41 may communicate with (e.g., may be exposed to) an interior 32 of the chamber 30.

Figure 13:
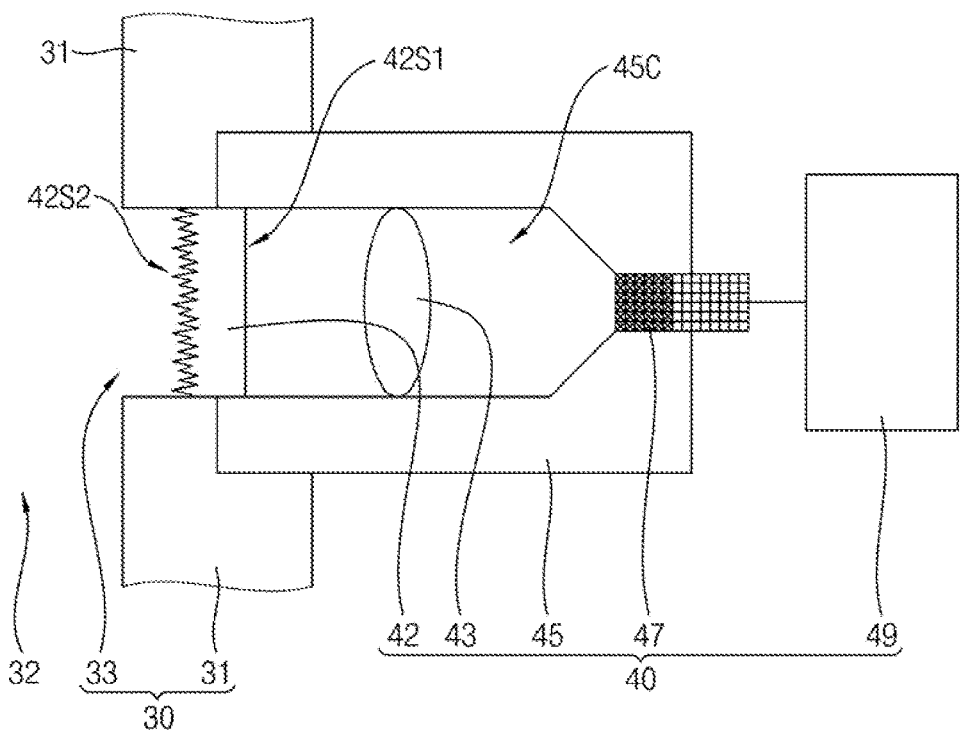

Referring to FIG. 13, a second window 42 may include a first surface 42S1, and a second surface 42S2 at an opposite side relative to the first surface 42S1. The second surface 42S2 of the second window 42 may communicate with an interior 32 of a chamber 30. The second surface 42S2 may be exposed to the interior 32. A first window ("41" in FIG. 1) may be omitted.

The first surface 42S1 of the second window 42 may be adjacent to or face a probe 47. The second surface 42S2 of the second window 42 may include or may be a scattering surface. In an implementation, the second surface 42S2 may be relatively rougher than the first surface 42S1. The root mean square (RMS) roughness of the second surface 42S2 may be 0.2 µm or more. In an implementation, the RMS roughness of the second surface 42S2 may be 0.2 to 10 µm.

A third window 43 may be between the second window 42 and the probe 47. The second surface 42S2 of the second window 42 may be relatively rougher than surfaces of the third window 43.

Figure 14:
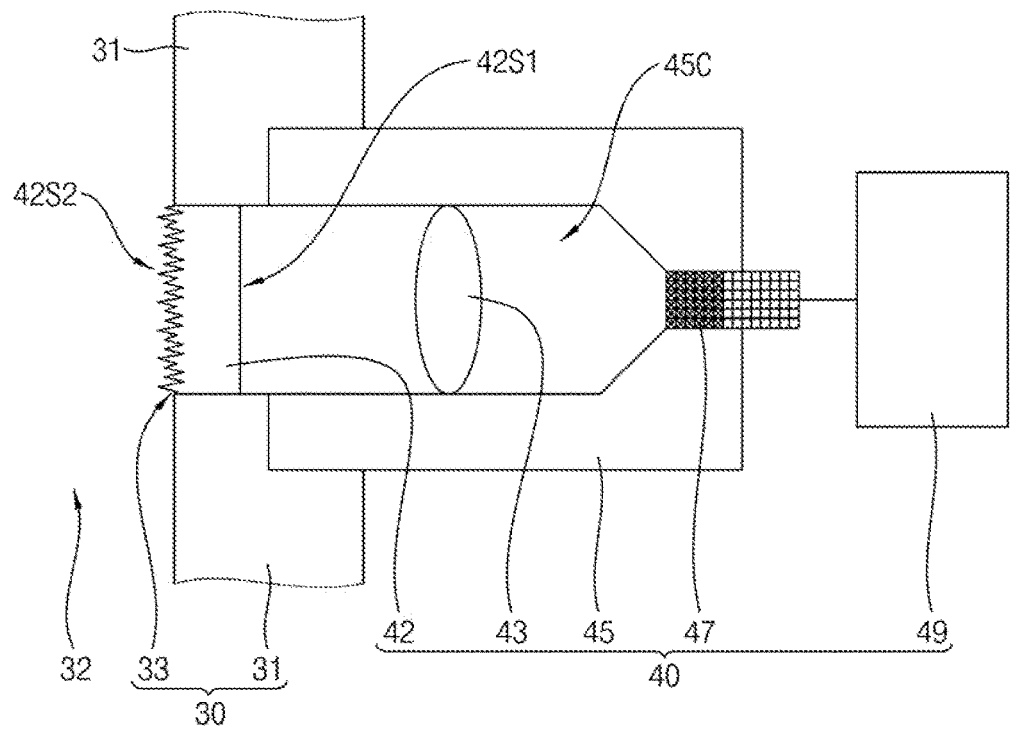

Referring to FIG. 14, a second window 42 may be defined within a viewport 33. The second window 42 may contact (e.g., directly contact) a wall 31. The second window 42 may be spaced apart from a case 45.

Figure 15:
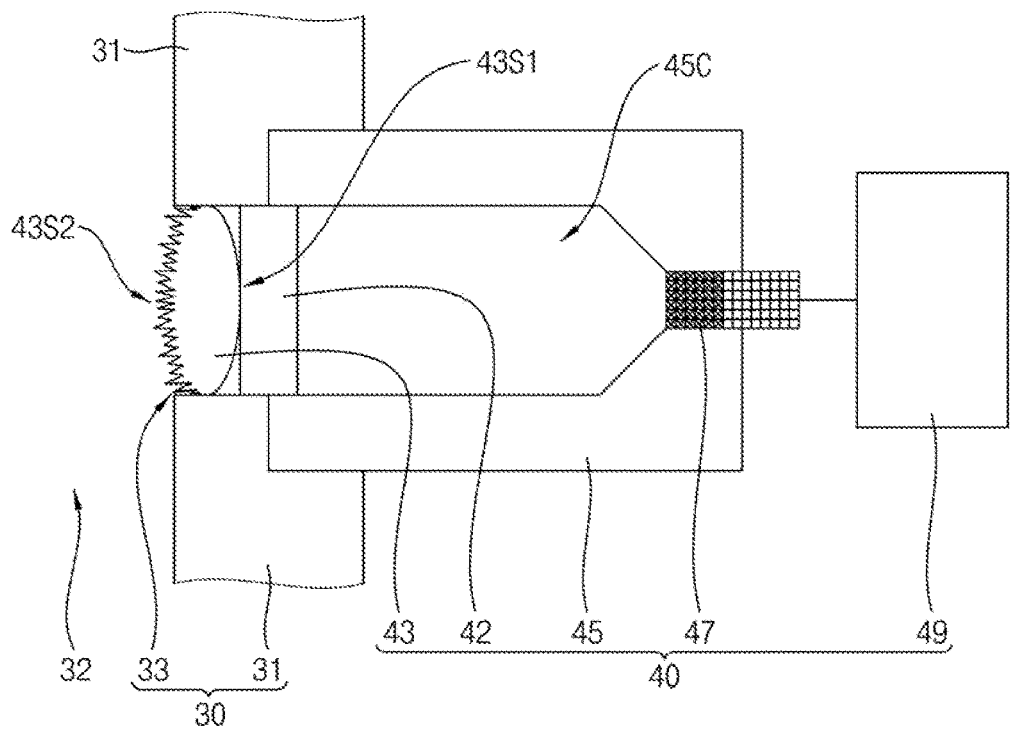

Referring to FIG. 15, a third window 43 may be defined within a viewport 33. The third window 43 may contact (e.g., directly contact) a wall 31. The third window 43 may be spaced apart from a case 45. The third window 43 may include a first surface 43S1, and a second surface 43S2 at an opposite side relative to the first surface 43S1. At least one surface of the third window 43 may include or may be a spherical surface. In an implementation, the third window 43 may include or may be a convex lens.

The first surface 43S1 of the third window 43 may be adjacent to or face a probe 47. The second surface 43S2 of the third window 43 may protrude into an interior 32 of a chamber 30. The second surface 43S2 may be exposed to the interior 32. The second surface 43S2 may include or may be a scattering surface. In an implementation, the second surface 43S2 may be relatively rougher than the first surface 43S1. The root mean square (RMS) roughness of the second surface 43S2 may be 0.2 μm or more. In an implementation, the RMS roughness of the second surface 43S2 may be 0.2 to 10 μm.

A second window 42 may be between the third window 43 and the probe 47. The second window 42 may contact (e.g., directly contact) the first surface 43S1 of the third window 43. The second window 42 may contact (e.g., directly contact) the wall 31 and the case 45. The second surface 43S2 of the third window 43 may be relatively rougher than surfaces of the second window 42.

Figure 16:
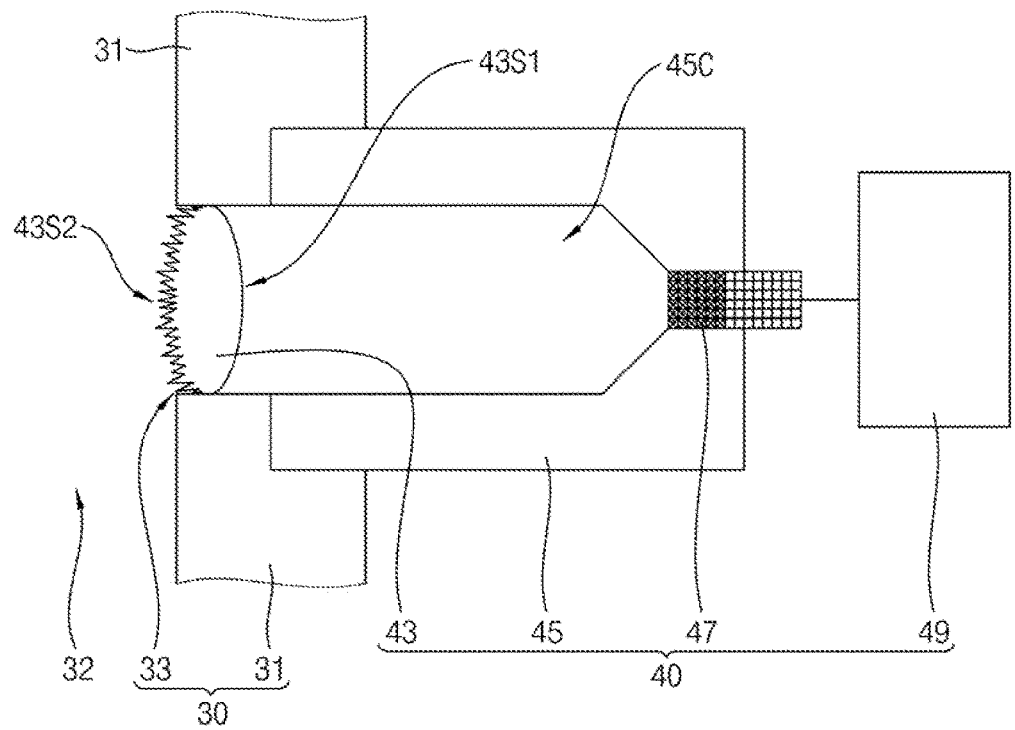

Referring to FIG. 16, a third window 43 may be defined within a viewport 33. The third window 43 may be spaced apart from a case 45. A second window ("42" in FIG. 15) may be omitted. The third window 43 may be aligned with a probe 47.

Figure 17:
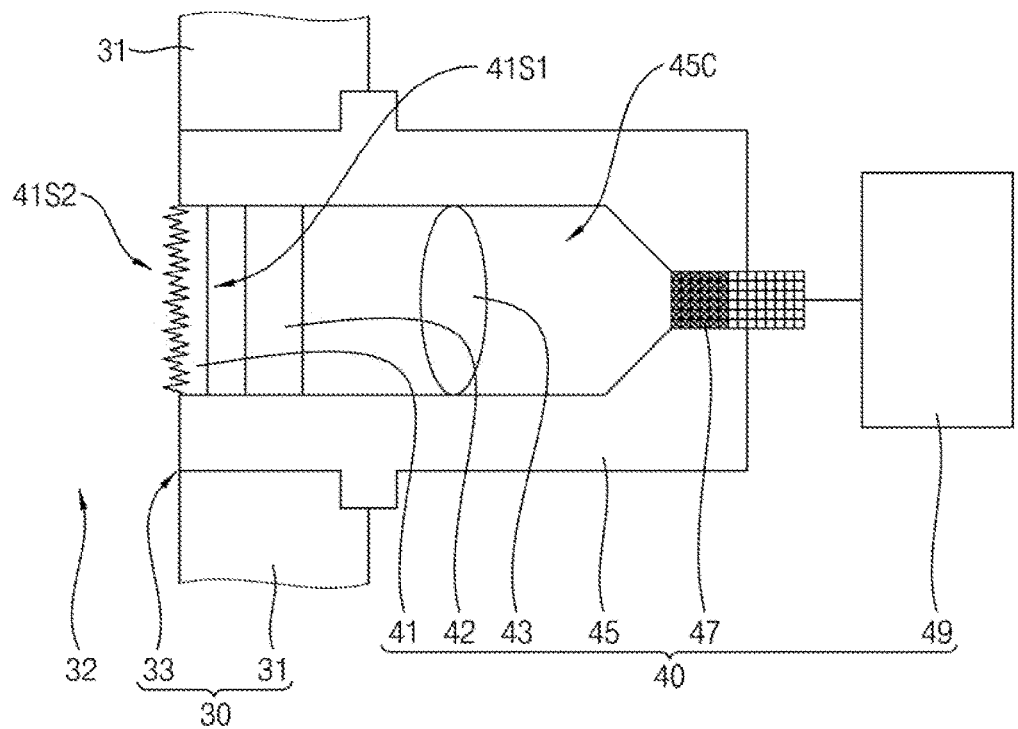

Referring to FIG. 17, a case 45 may be inserted into a viewport 33. A first window 41, a second window 42, and a third window 43 may be in a cavity 45C of the case 45. Each of the first window 41, the second window 42, and the third window 43 may contact (e.g., directly contact) the case 45. The case 45 may be exposed to an interior 32 of a chamber 30.

Figure 18:
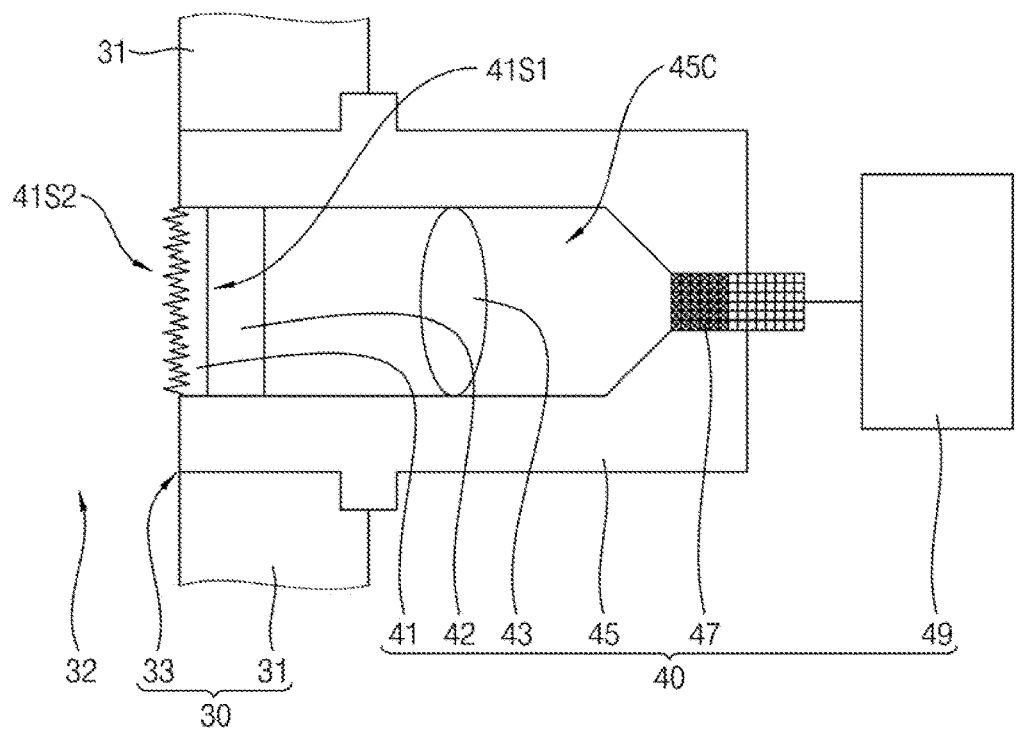

Referring to FIG. 18, a first window 41, a second window 42, and a third window 43 may be in a cavity 45C of a case 45. The second window 42 may contact (e.g., directly contact) the first window 41.

Figure 19:
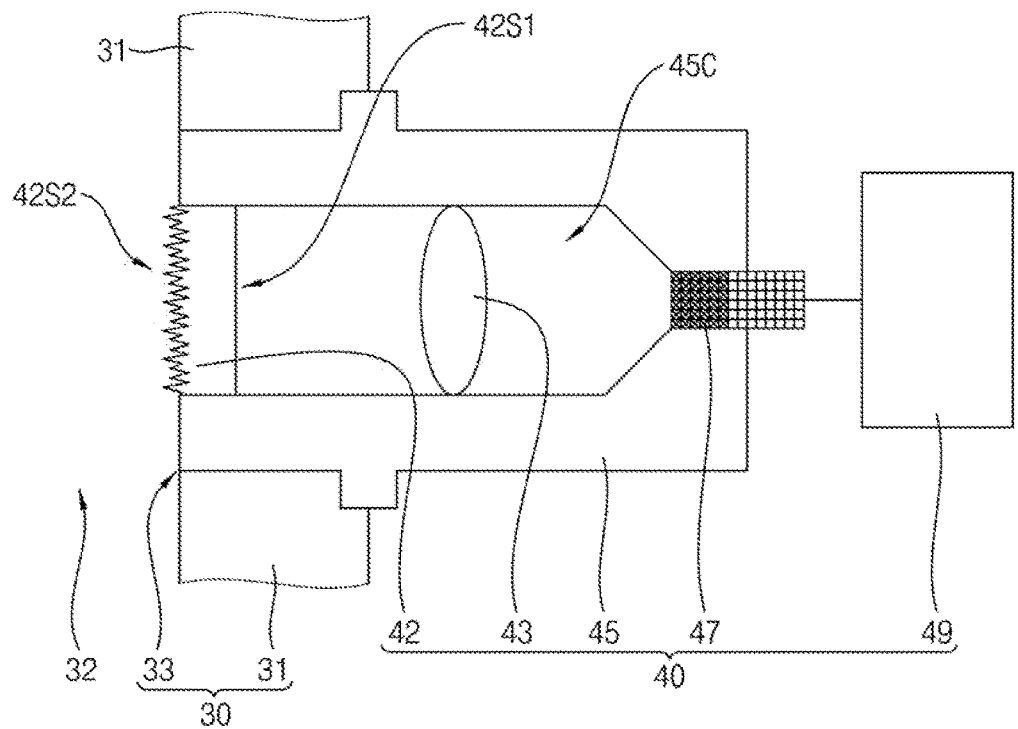

Referring to FIG. 19, a second window 42 and a third window 43 may be in a cavity 45C of the case 45. The first window ("41" in FIG. 18) may be omitted. A second surface 42S2 of the second window 42 may communicate with (e.g., may be exposed to) an interior 32 of a chamber 30. The second surface 42S2 may include or may be a scattering surface.

Figure 20:
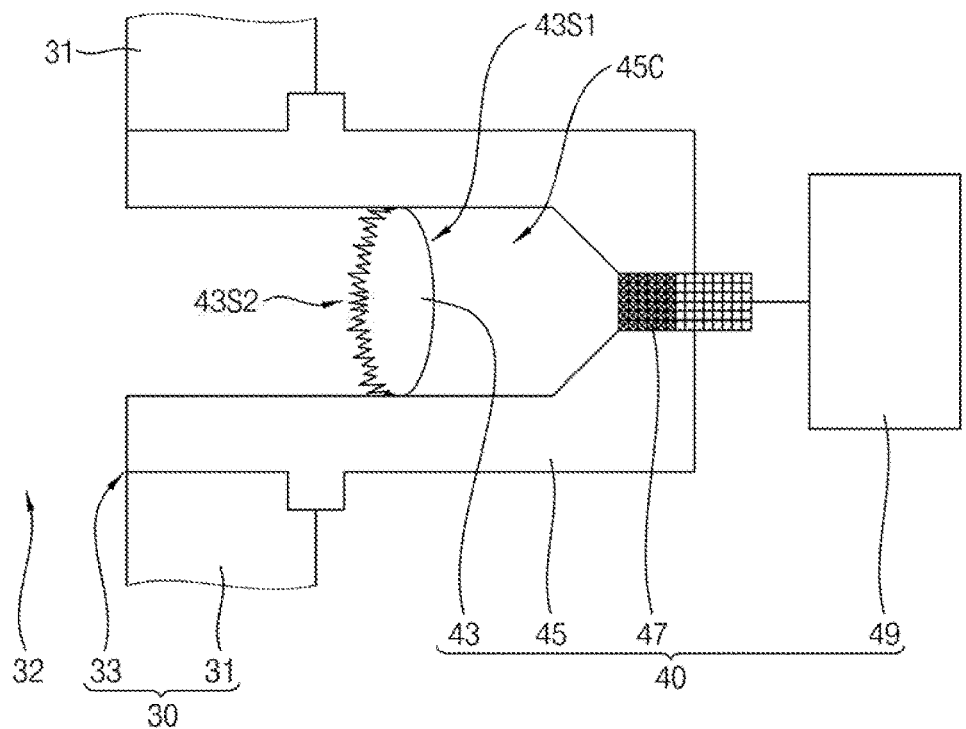

Referring to FIG. 20, a third window 43 may be in a cavity 45C of a case 45. The first window ("41" in FIG. 18) and the second window ("42" in FIG. 19) may be omitted. A second surface 43S2 of the third window 43 may communicate with or be exposed to an interior 32 of a chamber 30. The second surface 43S2 may include or may be a scattering surface.

Figure 21:
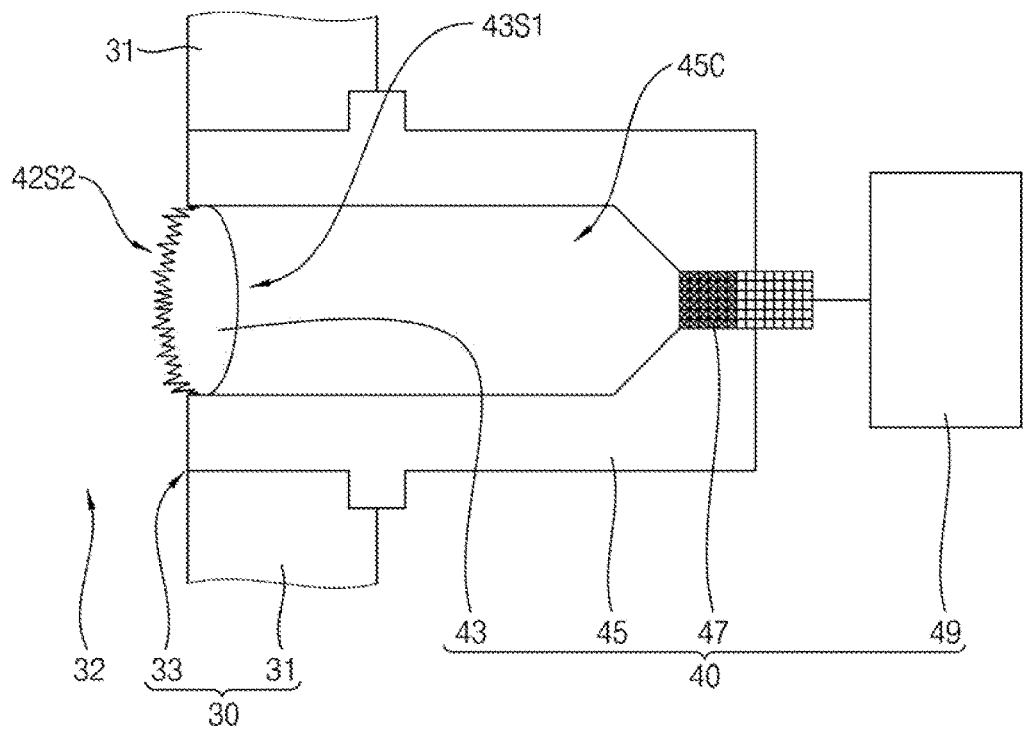

Referring to FIG. 21, a third window 43 may be in a cavity 45C of a case 45. A second surface 43S2 of the third window 43 may protrude into an interior 32 of a chamber 30. The second surface 43S2 may include or may be a scattering surface. The third window 43 may contact (e.g., directly contact) the case 45.

Figure 22:
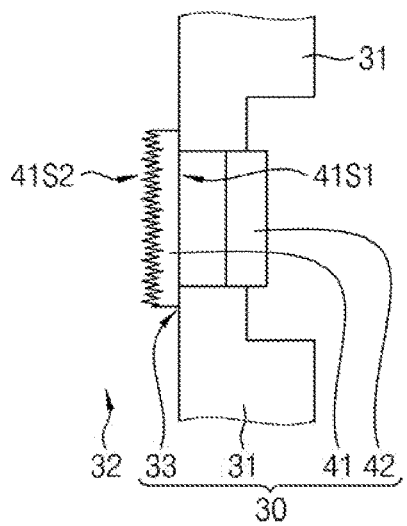

Referring to FIG. 22, a chamber 30 may include a wall 31 defining an interior 32 of the chamber 30, and a viewport 33 extending through the wall 31. The viewport 33 may include a first window 41 and a second window 42. The first window 41 may include a first surface 41S1, and a second surface 41S2 at an opposite side relative to the first surface 41S1.

The second surface 41S2 may communicate with or be exposed to the interior 32 of the chamber 30. The second surface 41S2 may protrude into the interior 32. The second surface 41S2 may include or may be a scattering surface. The second window 42 may be outside the first window 41. The second window 42 may be adjacent to the first surface 41S1. The first window 41 may be between the interior 32 and the second window 42. The first window 41 and the second window 42 may contact (e.g., directly contact) the wall 31.

Figure 23:
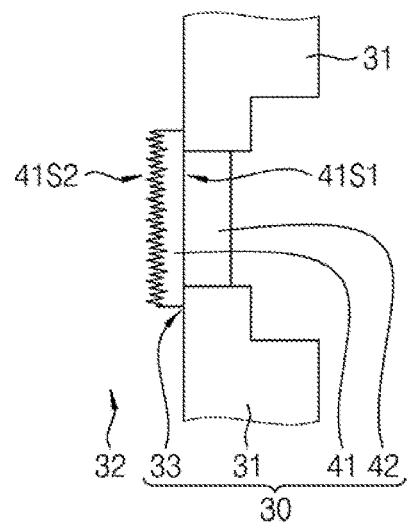

Referring to FIG. 23, a second window 42 may contact (e.g., directly contact) a first surface 41S1 of a first window 41.

Figure 24:
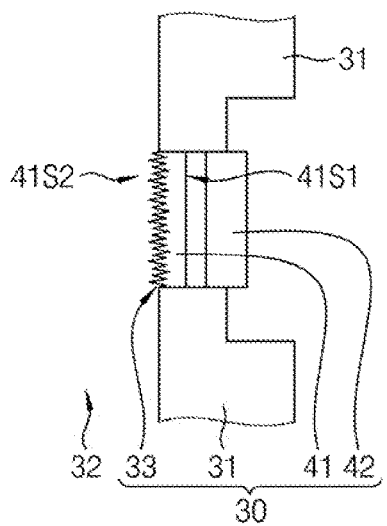

Referring to FIG. 24, a first window 41 may be defined within a viewport 33. A second window 42 may be spaced apart from the first window 41.

Figure 25:
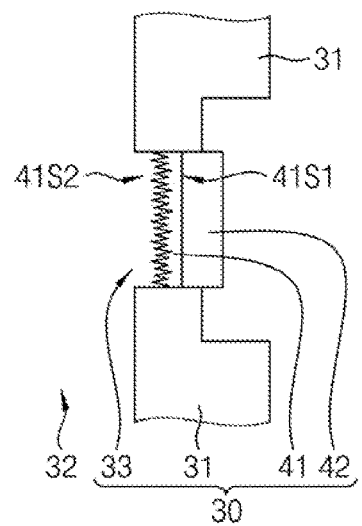

Referring to FIG. 25, a first window 41 may be defined within a viewport 33. A second window 42 may contact (e.g., directly contact) a first surface 41S1 of the first window 41.

Figure 26:
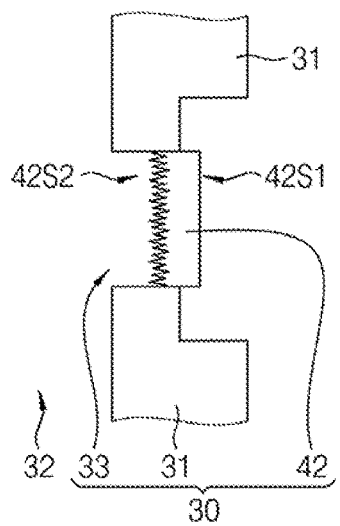

Referring to FIG. 26, a second window 42 may be in a viewport 33. The first window ("41" in FIG. 25) may be omitted. A second surface 42S2 of the second window 42 may communicate with or be exposed to an interior 32 of a chamber 30. The second surface 42S2 may include or may be a scattering surface.

Figure 27:
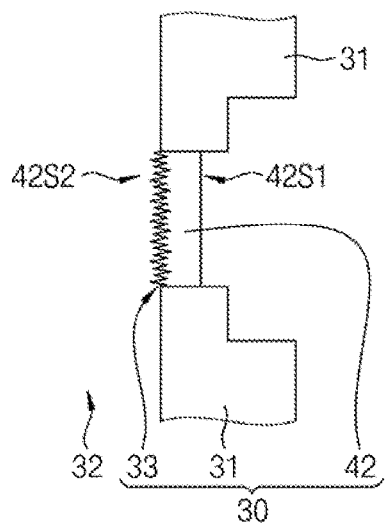

Referring to FIG. 27, a second surface 42S2 of a second window 42 may protrude into an interior 32 of a chamber 30. The second surface 42S2 may be exposed to the interior 32.

By way of summation and review, by-products produced in the interior of a plasma processing apparatus in accordance with execution of a process may contaminate a viewport. Contamination of the viewport could cause generation of an interference signal.

In accordance with exemplary embodiments of the disclosure, a window having a scattering surface may be disposed at a viewport. The window having the scattering surface may help attenuate an interference signal, minimize an increase in the interference signal, and minimize an increase in scattering of the interference signal. A plasma processing apparatus, an analysis apparatus and a chamber, which are capable of minimizing influence of the interference signal, may be realized.

One or more embodiments may provide a plasma processing apparatus, an analysis apparatus, and a chamber which are capable of minimizing influence of an interference signal.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a plasma processing apparatus, the method comprising:
    providing a chamber, the chamber including a wall defining an interior, and a viewport extending through the wall; and
    forming an analysis apparatus connected to the viewport, wherein:

the analysis apparatus includes:
an analyzer adjacent to the chamber,
a probe connected to the analyzer and aligned with the viewport,
a first window aligned with the probe, the first window having a first surface, and a second surface at an opposite side relative to the first surface, the second surface being exposed to the interior of the chamber, and
a second window between the first window and the probe, the second surface of the first window has a scattering surface, and
each of the first window and the second window contacts the wall.

2. The method as claimed in claim 1, wherein a roughness of the second surface of the first window is rougher than a roughness of the first surface of the first window.

3. The method as claimed in claim 1, wherein the second surface of the first window has a root mean square roughness of 0.2 µm to 10 µm.

4. The method as claimed in claim 1, wherein the first window includes quartz or glass.

5. The method as claimed in claim 1, wherein at least one of the first surface and the second surface includes a spherical surface.

6. The method as claimed in claim 1, wherein the first window includes a convex lens.

7. The method as claimed in claim 1, wherein a thickness of the second window is greater than a thickness of the first window.

8. The method as claimed in claim 1, wherein a roughness of the second surface of the first window is rougher than surfaces of the second window.

9. The method as claimed in claim 1, further comprising a third window between the second window and the probe.

10. The method as claimed in claim 9, wherein the third window includes a convex lens.

11. A method of forming a semiconductor device using a plasma processing apparatus, the method comprising:
loading a substrate in a chamber, the chamber including a wall defining an interior, and a viewport extending through the wall; and
monitoring a state of the interior of the chamber through an analysis apparatus connected to the viewport,
wherein:
the analysis apparatus includes:
an analyzer adjacent to the chamber,
a probe connected to the analyzer and aligned with the viewport,
a first window aligned with the probe, the first window having a first surface, and a second surface at an opposite side relative to the first surface, the second surface being exposed to the interior of the chamber, and
a second window between the first window and the probe,
the second surface of the first window has a scattering surface,
each of the first window and the second window contacts the wall, and
a roughness of the second surface of the first window is rougher than a roughness of the first surface of the first window.

12. A plasma processing apparatus, comprising:
a chamber, the chamber including a wall defining an interior, and a viewport extending through the wall; and
an analysis apparatus connected to the viewport,
wherein:
the analysis apparatus includes:
an analyzer adjacent to the chamber,
a probe connected to the analyzer and aligned with the viewport,
a first window aligned with the probe, the first window having a first surface, and a second surface at an opposite side relative to the first surface, the second surface being exposed to the interior of the chamber, and
a second window between the first window and the probe,
the second surface of the first window has a scattering surface, and
each of the first window and the second window contacts the wall.

13. The plasma processing apparatus as claimed in claim 12, wherein a roughness of the second surface of the first window is rougher than a roughness of the first surface of the first window.

14. The plasma processing apparatus as claimed in claim 12, wherein the second surface of the first window has a root mean square roughness of 0.2 µm to 10 µm.

15. The plasma processing apparatus as claimed in claim 12, wherein the first window includes quartz or glass.

16. The plasma processing apparatus as claimed in claim 12, wherein at least one of the first surface and the second surface includes a spherical surface.

17. The plasma processing apparatus as claimed in claim 12, wherein the first window includes a convex lens.

* * * * *